US012598799B2

(12) United States Patent
Joh et al.

(10) Patent No.: US 12,598,799 B2
(45) Date of Patent: Apr. 7, 2026

(54) HIGH VOLTAGE FINGER LAYOUT TRANSISTOR

(71) Applicant: Texas Instruments Incorporated, Dallas, TX (US)

(72) Inventors: Jungwoo Joh, Allen, TX (US); Sunglyong Kim, Allen, TX (US); Seetharaman Sridhar, Richardson, TX (US); Sameer Pendharkar, Allen, TX (US); James Craig Ondrusek, Richardson, TX (US); Srikanth Krishnan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 454 days.

(21) Appl. No.: 17/463,529

(22) Filed: Aug. 31, 2021

(65) Prior Publication Data

US 2023/0061337 A1      Mar. 2, 2023

(51) Int. Cl.
| | |
|---|---|
| *H10D 64/23* | (2025.01) |
| *H01L 23/482* | (2006.01) |
| *H10D 30/01* | (2025.01) |
| *H10D 30/65* | (2025.01) |
| *H10D 62/10* | (2025.01) |
| *H10D 62/13* | (2025.01) |
| *H10D 64/27* | (2025.01) |
| *H10D 84/87* | (2025.01) |

(52) U.S. Cl.
CPC ....... *H10D 64/257* (2025.01); *H01L 23/4824* (2013.01); *H10D 30/0281* (2025.01); *H10D 30/65* (2025.01); *H10D 62/127* (2025.01); *H10D 62/154* (2025.01); *H10D 62/158* (2025.01); *H10D 64/519* (2025.01); *H10D 84/87* (2025.01)

(58) Field of Classification Search
CPC .......... H01L 29/41758; H01L 29/4238; H01L 29/66681; H01L 29/7816; H01L 21/76224; H10D 30/65; H10D 30/655; H10D 30/657; H10D 30/658; H10D 30/659; H10D 30/0281; H10D 30/0285; H10D 30/0287; H10D 30/0289; H10D 62/126
See application file for complete search history.

(56) References Cited

U.S. PATENT DOCUMENTS

| | | | | | |
|---|---|---|---|---|---|
| 5,258,636 A | * | 11/1993 | Rumennik | ........... | H10D 62/126 |
| | | | | | 257/341 |
| 6,515,302 B1 | * | 2/2003 | Cooper, Jr. | .......... | H10D 62/364 |
| | | | | | 257/370 |
| 2001/0050375 A1 | * | 12/2001 | Van Dalen | ........... | H10D 64/112 |
| | | | | | 257/E29.328 |
| 2004/0178443 A1 | * | 9/2004 | Hossain | ............... | H10D 30/603 |
| | | | | | 257/287 |
| 2012/0037986 A1 | * | 2/2012 | Kim | ....................... | H10D 30/65 |
| | | | | | 257/E29.256 |

(Continued)

*Primary Examiner* — Aaron J Gray

(74) *Attorney, Agent, or Firm* — Xiaotun Qiu; Frank D. Cimino

(57) ABSTRACT

An integrated circuit, including a source region, a drain region, a channel region between the source region and the drain region, and a gate for inducing a conductive path through the channel region. The integrated circuit also includes structure, proximate a curved length of the gate, for inhibiting current flow along a portion of the channel region.

12 Claims, 8 Drawing Sheets

(56) References Cited

U.S. PATENT DOCUMENTS

| | | | |
|---|---|---|---|
| 2012/0261752 A1* | 10/2012 | Lee | H10D 62/127 |
| | | | 257/341 |
| 2014/0008725 A1* | 1/2014 | Chen | H10D 62/116 |
| | | | 257/E29.256 |
| 2014/0061788 A1* | 3/2014 | Chen | H10D 30/0281 |
| | | | 438/286 |
| 2014/0175560 A1* | 6/2014 | Chan | H01L 21/02697 |
| | | | 438/585 |
| 2014/0319613 A1* | 10/2014 | He | H10D 30/65 |
| | | | 257/355 |
| 2016/0276477 A1* | 9/2016 | Wada | H10D 8/00 |
| 2021/0043741 A1* | 2/2021 | Hu | H10D 62/127 |

* cited by examiner

HIGH VOLTAGE FINGER LAYOUT TRANSISTOR

CROSS-REFERENCE TO RELATED APPLICATION

Not applicable.

BACKGROUND

The example embodiments relate to semiconductor integrated circuit (IC) fabrication, for example with respect to high voltage transistors.

One or more high voltage (HV) transistors may be formed as a discrete IC or as part of a more complex circuit layout within an IC. An HV transistor application is configured to receive or operate at a voltage beyond a relatively high voltage threshold, where for example an 80 volt or higher application is typically considered high voltage in contemporary devices. Such devices may be used, particularly as drivers and amplifiers, in various systems, with examples including motors, displays, and certain higher-power equipment. For such usages, the transistor is specified to have a safe operating area (SOA), which is typically described in one or more current/voltage plots, each of which provides the conditions, including duration, over which the transistor can operate without incurring fault or damage.

HV transistors may be formed in various layout configurations, typically with consideration to transistor operating voltage and size (including area). One approach is a multi-finger layout, in which the transistor gate includes at least two typically-parallel paths, sometimes referred to as fingers, which are electrically connected to one another. The plural paths increase total gate width in a same space where shorter total gate width would be achieved in a conventional (single finger) gate topology. The plural paths also permit sharing of either source and/or diffusion regions, that are between two parallel gate portions.

While the preceding has implementation in various prior art devices, this document provides example embodiments that may improve on certain of the above concepts, as detailed below.

SUMMARY

An integrated circuit, including a source region, a drain region, a channel region between the source region and the drain region, and a gate for inducing a conductive path through the channel region. The integrated circuit also includes structure, proximate a curved length of the gate, for inhibiting current flow along a portion of the channel region.

Other aspects are also described and claimed.

DETAILED DESCRIPTION

Figure 1:
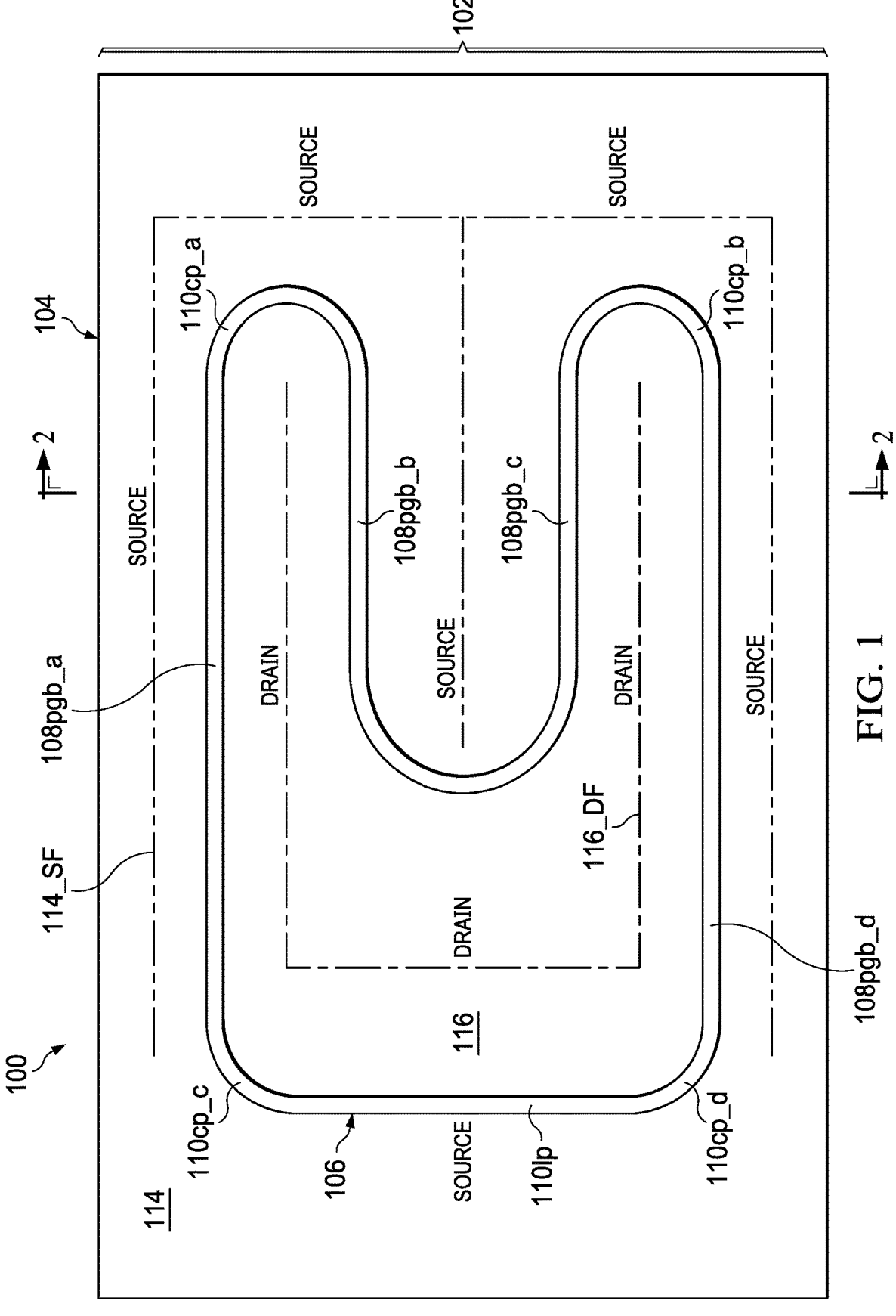
FIG. 1 is a top view of an IC including a finger layout transistor (FLT).

FIG. 1 is a top view of an IC 100. The IC 100 includes a finger layout transistor (FLT) 102, which may be a stand-alone discrete device, or may be included in the IC 100 as part of a multi-component device that includes plural electronic circuit elements. The FLT 102 as illustrated in FIG. 1 has some attributes known in the art, but is improved as further detailed in this document.

In an example embodiment, the FLT 102 is formed in a semiconductor substrate 104, which may be silicon, by way of example. The FLT 102 includes a gate 106, which is formed generally of a conductive material, for example as doped polysilicon or metal (which can be preceded by a sacrificial polysilicon member). The gate 106 includes, along its layout path, four generally parallel gate portions 108*pgp_a*, 108*pgp_b*, 108*pgp_c*, and 108*pgp_d*. Additionally, the gate 106 includes, along its layout path, four curved portions 110*cp_a*, 110*cp_b*, 110*cp_c*, and 110*cp_d*, and a linear portion 1121*p* between the curved portions 110*cp_c* and 110*cp_d*. Further, the curved portion 110*cp_c* is between the parallel gate portion 108*pgp_a* and the linear portion 1121*p*, and the curved portion 110*cp_d* is between the parallel gate portion 108*pgp_d* and the linear portion 1121*p*. In an example embodiment, each of the curved portions 110*cp_c* and 110*cp_d* has a same radius, r1, for example with 5 μm≤r1≤200 μm. Further, in the example embodiment, each of the curved portions 110*cp_c* and 110*cp_d* has the radius, r1, over a curve distance cd1 of approximately 90 degrees. The curved portion 110*cp_a* is also aligned between the parallel gate portions 108*pgp_a* and 108*pgp_b*, and the curved portion 110*cp_b* is aligned between the parallel gate portions 108*pgp_c* and 108*pgp_d*. In an example embodiment, each of the curved portions 110*cp_a* and 110*cp_b* has a same radius, r2, for example with 5 μm≤r1≤200 μm. In a particular example given these ranges, as shown in the example embodiment, r2<r1. Further, in the example embodiment, each of the curved portions 110*cp_a* and 110*cp_b* has the radius, r2, over a curve distance cd2 of approximately 180 degrees, that is, cd2>cd1.

The FLT 102 also includes a source region 114 and a drain region 116. Generally, from a top perspective, the source region 114 is outwardly positioned relative to the gate 106, and the source region 114 generally surrounds the gate 106. The drain region 116 is inwardly positioned relative to the gate 106, so the source region 114 also generally surrounds the drain region 116. Further, because the gate 106 includes parallel portions and, in some locations, a generally serpentine pattern, the source region 114 includes symmetrically positioned portions as source fingers 114_SF and the drain region 116 includes symmetrically positioned portions as drain fingers 116_DF, with the source fingers 114_SF and the drain fingers 116_DF generally interdigitated with respect to one another. The source and drain fingers 114_SF and 116_DF are shown having lengths by example and not necessarily to scale, as they may be considerably longer in implementation, relative to the other illustrated structures. In an example embodiment and described below, the drain region 116 also may include a separate drift region (see 208, FIG. 2), as may be implemented in laterally diffused metal oxide semiconductor (LDMOS) transistor. Further, the source region 114 and the drain region 116 typically include a same dopant conductivity type, for example, n-type dopant for an N-type transistor (or, p-type for a P-type transistor), with a transistor channel region between them and below the gate 106 (and below a gate insulator (for example, see 108gi_a, FIG. 2), also below the gate 106).

Figure 2:
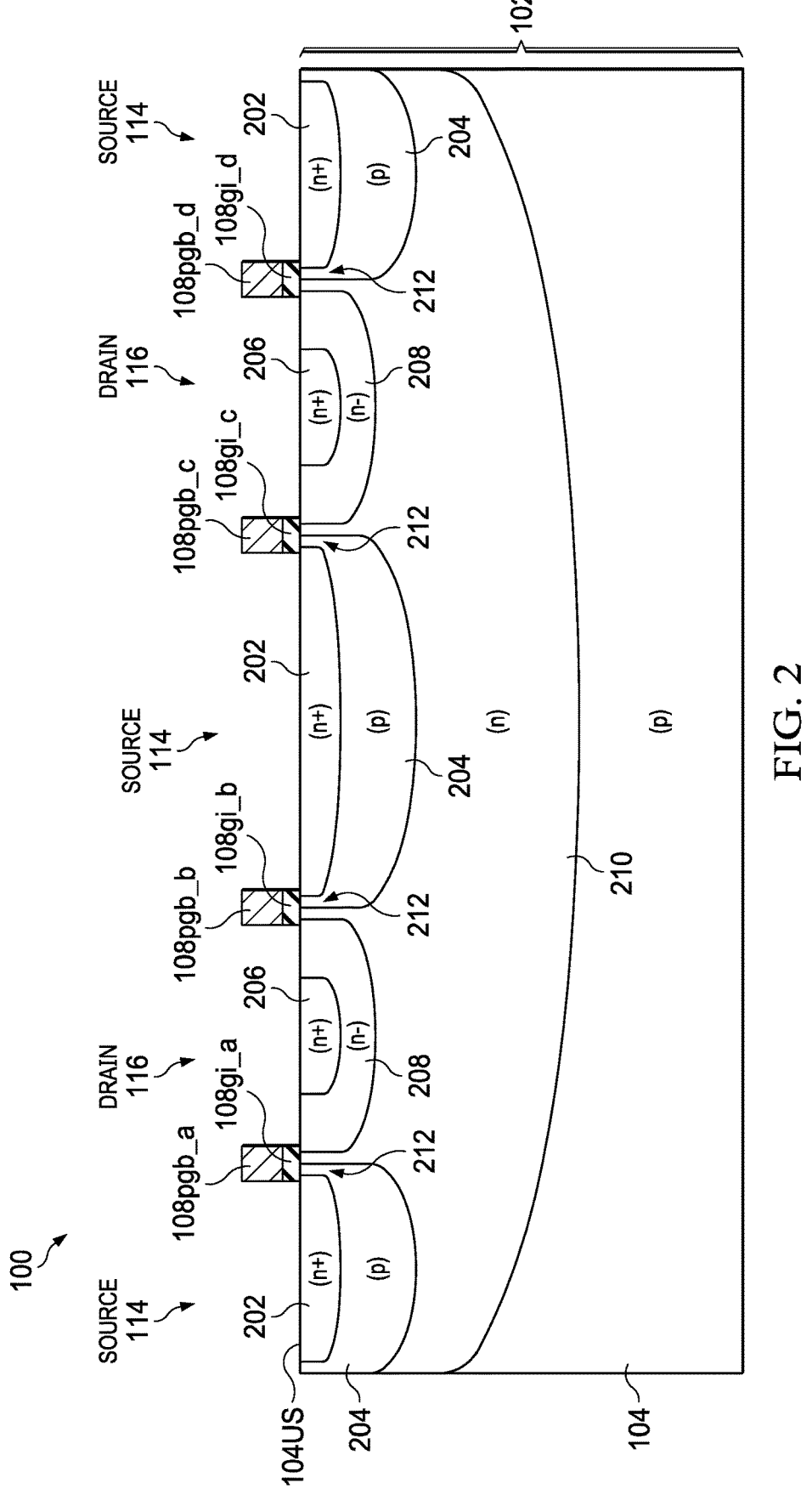
FIG. 2 is a cross-section of the FIG. 1 FLT.

FIG. 2 is a cross-section of the FIG. 1 FLT 102. The cross-section includes the parallel gate portions 108pgp_a, 108pgp_b, 108pgp_c, and 108pgp_d positioned above an upper surface 104US of the semiconductor substrate 104, each having below and between it and the upper surface 104US a respective gate insulator 108gi_a, 108gi_b, 108gi_c, and 108gi_d. In an example embodiment, the FLT 102 implements an LDMOS configuration. Accordingly, each instance of the source region 114 is a heavy doped (e.g., n+) source region 202 that diffuses laterally under one or more respective gate portions and that also is formed within a lighter and complementary conductivity type (e.g., p) region 204. Further, each instance of the drain region 116 is a heavy doped drain region 206 that functions as the transistor drain, and of the same dopant type (e.g., n+) as a heavy doped source region 202 of the source region 114. Each heavy doped drain region 206 is formed within, or electrically coupled to, a drift region 208 that is of a same conductivity type (e.g., n type) as the heavy doped source region 202 but with a lesser dopant concentration (e.g., n−), and a portion of each drift region 208 diffuses laterally under one or more respective gate portions. The entirety of the above-described doped regions may be formed in a well 210 having the same conductivity type (e.g., n type), albeit at a different dopant concentration, as the heavy doped source region 202 and the heavy doped drain region 206. Further, the well 210 is formed in the semiconductor substrate 104, which has a complementary (e.g., p type) conductivity type to the well 210.

Given the FIGS. 1 and 2 illustration and description, the operation of the FLT 102 will be readily understood by one skilled in the art. For example, a high voltage (e.g., 80 volts or higher) can be coupled via a contact (not separately shown) to the heavy doped drain regions 206 serving as the drain region 116, while a lower voltage (e.g., ground) is connected to the heavy doped source region 202. Further, a control voltage is then applied to the gate 106, thereby coupling the control voltage to the parallel gate portions 108pgp_a, 108pgp_b, 108pgp_c, and 108pgp_d. For an N-type transistor as shown, when a positive potential is applied to the gate, the potential attracts electrons into any p-type material beneath the gate and the corresponding gate insulator, thereby inducing an n-type channel in the p-type material. In this regard, FIG. 2 further indicates a channel area 212 corresponding to the general location in each complementary conductivity type region 204 where the n-type channel may be so induced. Electrons flowing through the channel area 212 can then pass to the adjoining opposite conductivity type (e.g., n type) region of the well 210 and continue toward the drain region 206, while in the LDMOS example also dissipating energy through an adjacent one of the drift regions 208.

Figure 3:
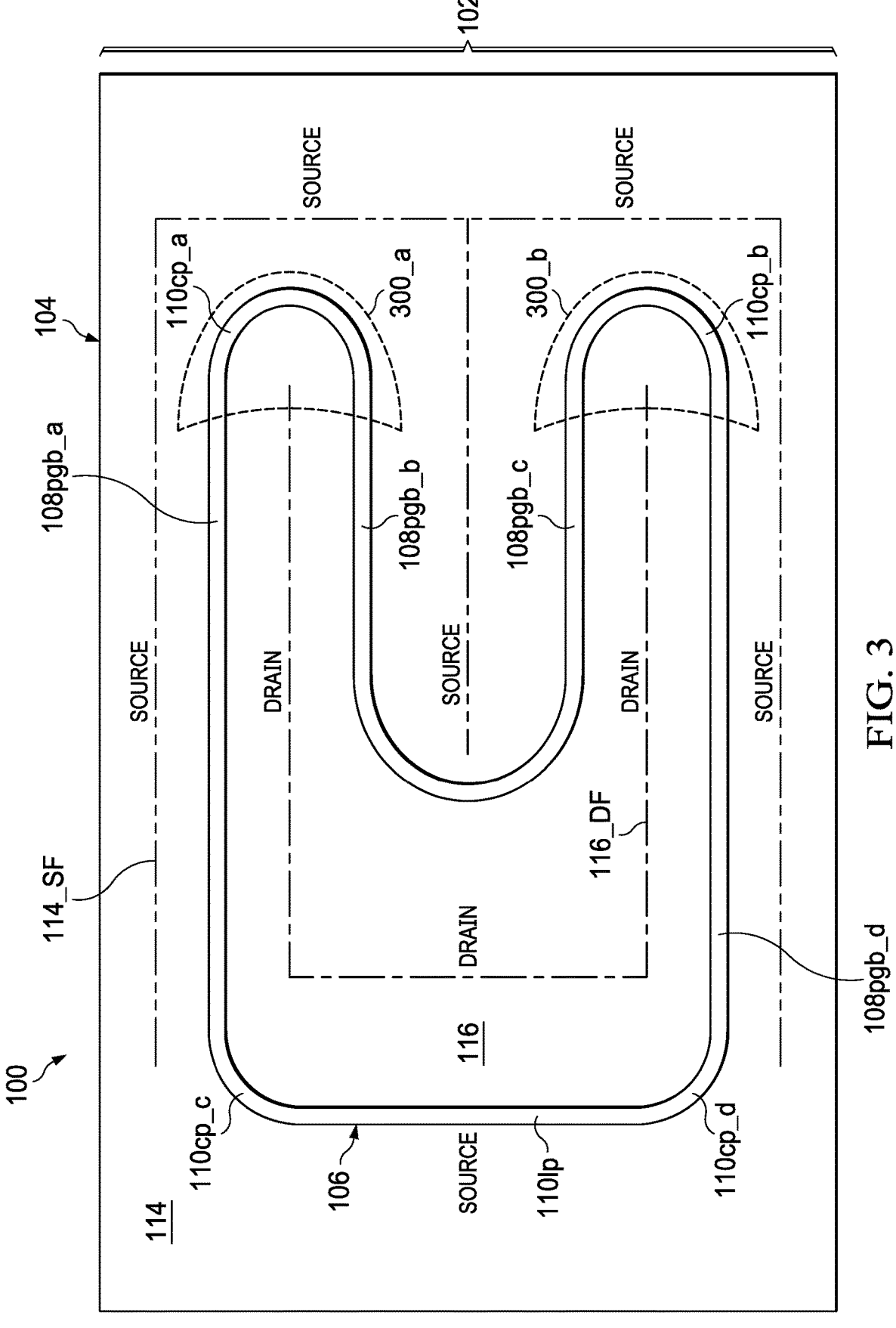
FIG. 3 illustrates additional aspects of the FIG. 1 IC.

FIG. 3 illustrates additional aspects of the FIG. 1 IC 100. In FIG. 3, the FLT 102 includes a first channel inhibiting region 300_a that is proximate the curved portion 110cp_a and a second channel inhibiting region 300_b that is proximate the curved portion 110cp_b. Each of the first and second channel inhibiting regions 300_a and 300_b is shown with dashed lines, as each is structural implementation, in the general vicinity within the respective dashed lines, to inhibit (reduce or eliminate) channel current conduction along the FIG. 2 channel area 212, to the extent the area 212 is within the FIG. 3 illustrated dashed lines. Accordingly, for the first channel inhibiting region 300_a, even when an enabling voltage is applied to the gate 106, the first channel inhibiting region 300_a inhibits channel current flow between the source region 114 and the drain region 116, in the vicinity of the curved portion 110cp_a. Similarly, the second channel inhibiting region 300_b, even when an enabling voltage is applied to the gate 106, inhibits channel current flow between the source region 114 and the drain region 116, in the vicinity of the curved portion 110cp_b. Accordingly, by reducing or eliminating current in the first and second channel inhibiting regions 300_a and 300_b, then potential attributes of such current, for example in areas of relatively small radii, are reduced. These reduced attributes could otherwise include, for example, higher electric fields, current crowding, and impact ionization. Reducing these attributes likewise reduces the potential complexities or even device failures that otherwise may arise. Notably, however, when an enabling voltage is applied to the gate 106, the lack of the same structural implementation in locations outside of the first and second channel inhibiting regions 300_a and 300_b thus enables channel current to otherwise flow in the FIG. 2 channel area 212, so that at least a majority of the area of the FLT 102 operates to conduct current at such time. For instance, in example embodiments, the total length of the gate 106 having an accompanying respective inhibiting region (e.g., first and second channel inhibiting regions 300_a and 300_b, or others) is less than ten percent of the entire length of the gate 106. Different embodiments are contemplated, with respectively different structural implementations for the first and second channel inhibiting regions 300_a and 300_b, with certain examples provided below.

Figure 4:
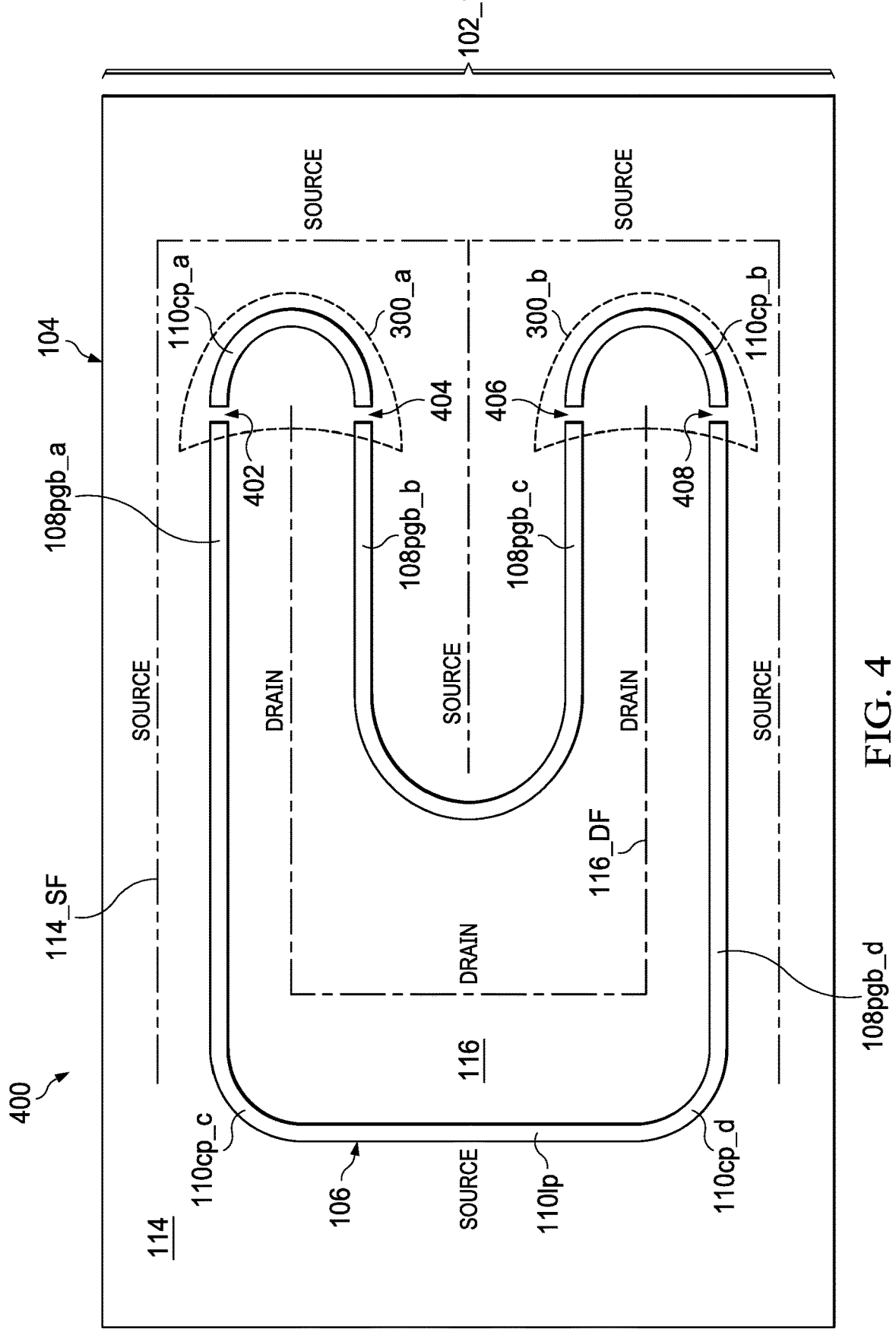
FIG. 4 is a plan view of the FIG. 1 IC 100, including a first implementation of the FIG. 1 FLT.

FIG. 4 is a plan view of an implementation of the FIG. 1 IC 100, shown in FIG. 4 as an IC 400 with an FLT 102_1. Generally, the FLT 102_1 embodies the earlier discussion of the FIG. 3 FLT 102, with a particular structural implementation to serve as the first and second channel inhibiting regions 300_a and 300_b. Specifically, along the path of the gate 106, two discontinuities 402 and 404 are formed in the first channel inhibiting region 300_a, and similarly along the path of the gate 106, two discontinuities 406 and 408 are formed in the second channel inhibiting region 300_b. Each of the discontinuities 402, 404, 406, and 408, is a location where the conductor of the gate 106 is not formed, for example by making the area of each discontinuity during the formation of the gate structure. Without forming the gate 106 in a location of a discontinuity, the conductive path of the gate 106 is interrupted. Accordingly, the curved portion 110cp_a remains within the first channel inhibiting region 300_a, but it is electrically isolated from the remaining majority length of the gate 106 as it exists in the rest of the FLT 102_1 (other than in the second channel inhibiting region 300_b, which also is isolated in the a comparable manner). Similarly, the curved portion 110cp_b remains within the second channel inhibiting region 300_b, but it is electrically isolated from the remaining majority length of the gate 106 as it exists in the rest of the FLT 102_1 (other than in the also-isolated first channel inhibiting region 300_a). Also in an example embodiment, since the FIG. 4 curved portions 110cp_a and 110cp_b are isolated from the remainder of the gate 106, each may be electrically biased differently than the remainder of the gate 106, for example those portions may be connected to ground. Accordingly, when an enabling potential is applied to the gate 106, that potential is not connected to the curved portions 110cp_a and 110_cp_b_, so channel current will not flow in the area of the first and second channel inhibiting regions 300_a_ and 300_b_.

Figure 5:
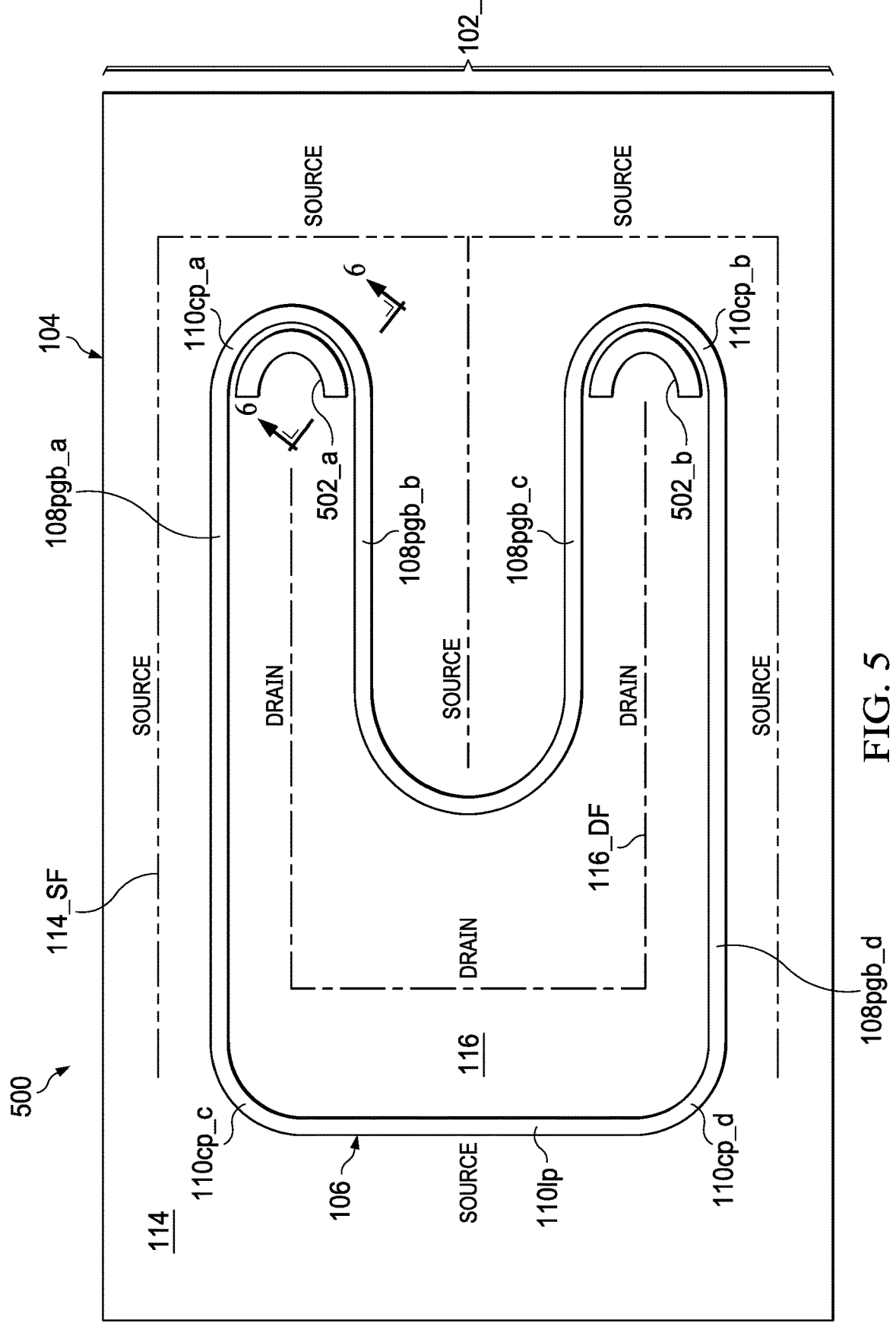
FIG. 5 is a plan view of the FIG. 1 IC 100, including a second implementation of the FIG. 1 FLT.
Figure 6:
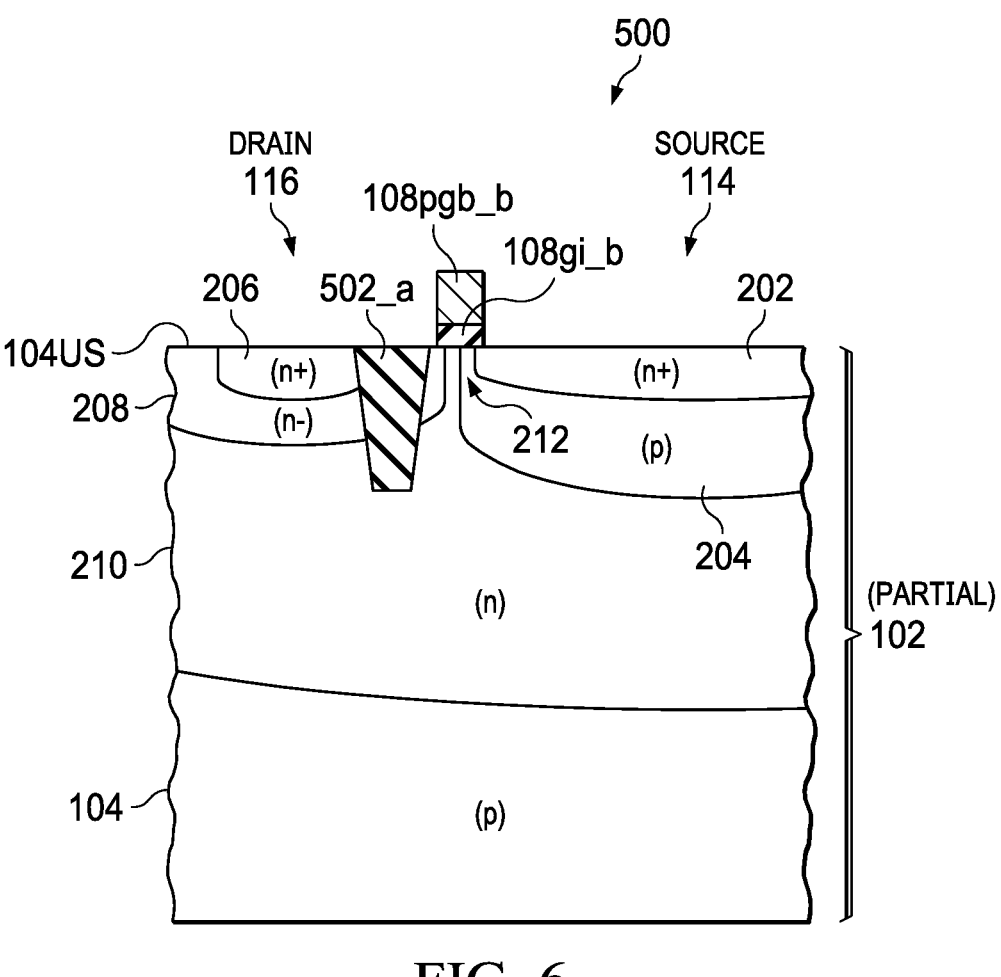
FIG. 6 is a cross-sectional diagram along the FIG. 5 line 6-6.

FIG. 5 illustrates a plan view of another implementation of the FIG. 1 IC 100, shown as an IC 500 and with an FLT 102_2 that implements different structure to serve as the FIG. 3 first and second channel inhibiting regions 300_a_ and 300_b_. In the FLT 102_2, each of the first and second channel inhibiting regions 300_a_ and 300_b_ includes a respective channel blocking insulator 502_a_ and 502_b_, as both a physical and electrical barrier adjacent the proximate one of the curved portions 110_cp_a_ and 110_cp_b_. In an example embodiment, each of the first and second channel inhibiting regions 300_a_ and 300_b_ is aligned generally parallel to and approximately the same curved length as the respective one of the curved portions 110_cp_a_ and 110_cp_b_. As further illustration, FIG. 6 is a cross-sectional diagram along the FIG. 5 line 6-6, thereby including a cross-section across the channel block insulator 502_a_. In the FIG. 6 example, the channel block insulator 502_a_ is formed, for example, using shallow trench isolation (STI), between the heavy doped drain region 206 and the channel area 212. Further, the depth of the channel block insulator 502_a_, into the semiconductor substrate 104 (or, in the example, into the well 210), is selected to impede current flow, for example extending at least as deep as the heavy doped source region 202. Accordingly, channel current is impeded from flowing between the source region 114 and the drain region 116, and more particularly in the area of the first channel inhibiting region 300_a_. Further, and as shown in FIG. 5, the same effect is achieved by the channel block insulator 502_b_ with respect to the second channel inhibiting region 300_b_. Lastly, locating the channel block insulators 502_a_ and 502_b_ on the drain side of the gate 106 may be preferred, as compared to the source side, due to the proximity or overlap of the gate 106 to the source region 114.

Figure 7:
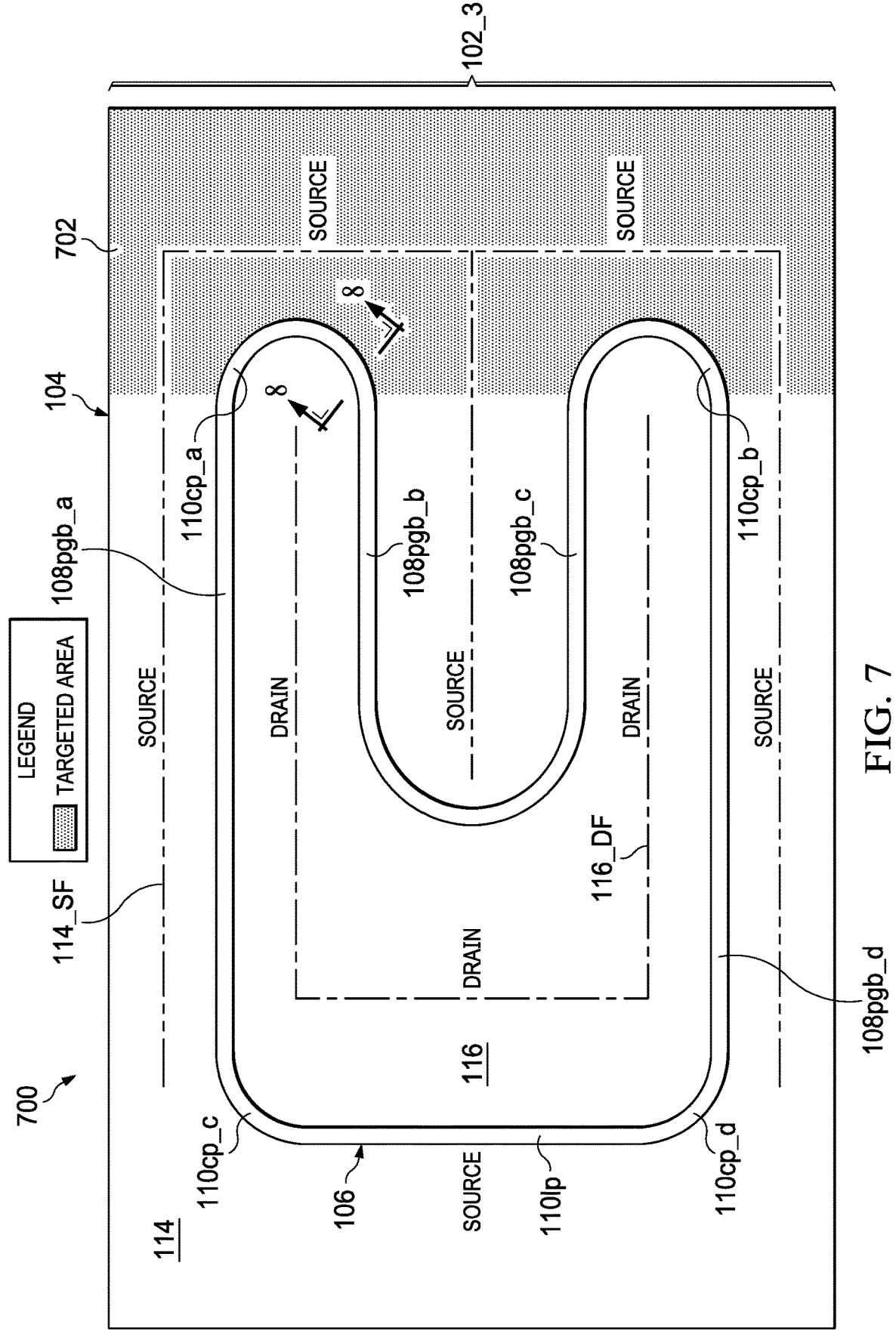
FIG. 7 is a plan view of the FIG. 1 IC 100, including a third implementation of the FIG. 1 FLT.
Figure 8:
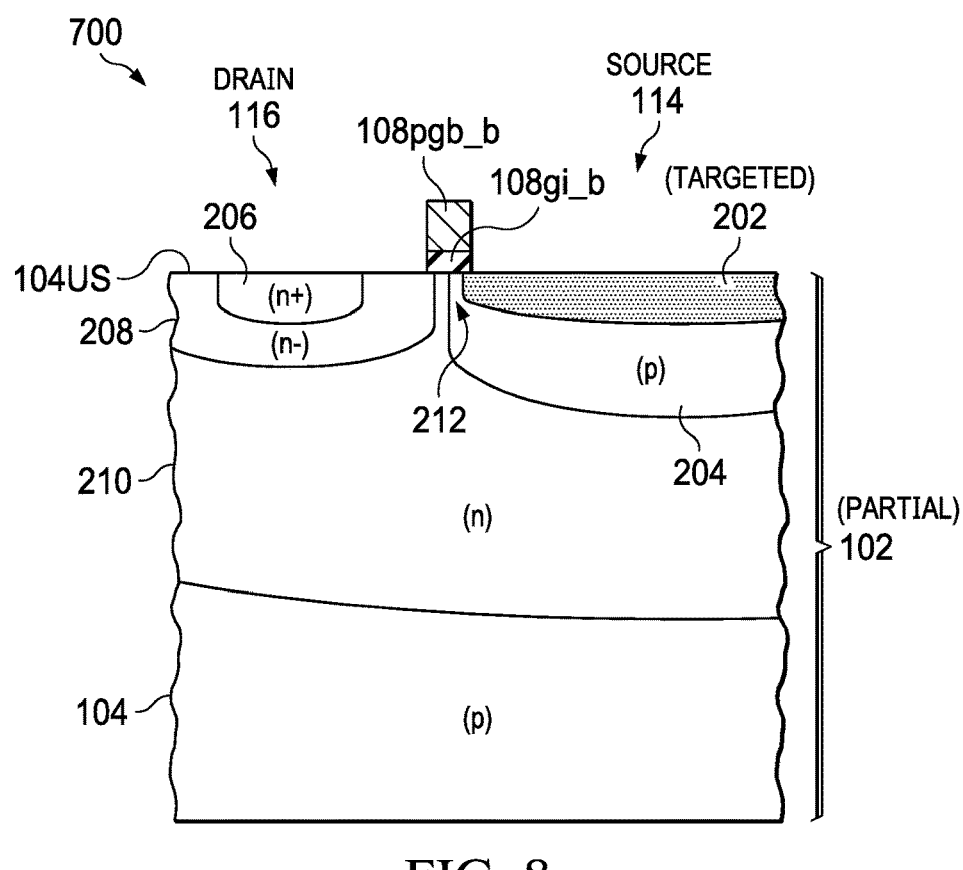
FIG. 8 is a cross-sectional diagram along the FIG. 7 line 8-8.

FIG. 7 illustrates a plan view of another implementation of the FIG. 1 IC 100, shown as an IC 700 and with an FLT 102_3 that implements different structure to serve as the FIG. 3 first and second channel inhibiting regions 300_a_ and 300_b_. In the FLT 102_3, each of the first and second channel inhibiting regions 300_a_ and 300_b_ are implemented by inhibiting the source region at least in those areas. As a first example, the inhibition can be achieved by masking a targeted area 702, so as to inhibit the formation of at least part of the source region 114 (which inhibited part could include the source contact, not shown), as shown in FIG. 7 by shading and the corresponding legend. In an example embodiment, the targeted area 702 includes, but can extend beyond, each of the first and second channel inhibiting regions 300_a_ and 300_b_, so as to at least be formed proximate the curved portions 110_cp_a_ and 110_cp_b_. As further illustration, FIG. 8 is a cross-sectional diagram along the FIG. 7 line 8-8, thereby including a cross-section across the targeted area 702. In FIG. 8, and only for illustration purposes, the heavy doped source region 202 is shown in phantom, that is, with a dashed outline and the masking pattern from FIG. 7, to demonstrate that the heavy doped source region 202 is prevented from forming in the area shown, while it is formed in the remainder of the area of the source region 114, as shown in the FIG. 7 plan view. Accordingly, in the area of the first channel inhibiting region 300_a_, and where the heavy doped source region 202 is not formed, the remaining structure associated with the source is the complementary conductivity type (e.g., p) region 204, which in an N-type transistor will not source channel current between the source region 114 and the drain region 116. Further, and as shown in FIG. 7, the same effect is achieved by the targeted area 702 with respect to the second channel inhibiting region 300_b_. Further, as a second example, either in addition to or instead of masking, some other source blocking effect may be implemented in the targeted area 702, for example by an intended damaging implant (e.g., argon) in the targeted area 702, so as to diminish or destroy the conductive operability of the source region 114 in the targeted area 702. In either event, outside of the targeted area 702, the majority of the drain region 116 remains surrounded by a functionally-operable source region 114, that is, so that conduction may occur between the source region 114 and the drain region 116, outside of the targeted area 702.

Figure 9:
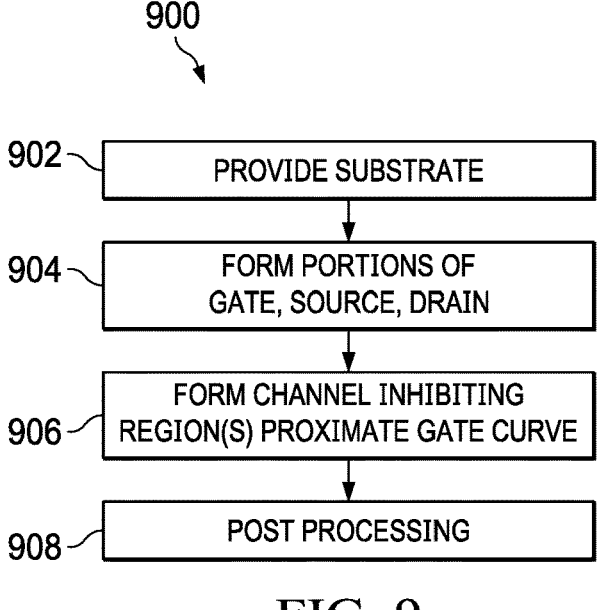
FIG. 9 is a flow diagram of an example embodiment method for forming an FLT.

FIG. 9 is a flow diagram of an example embodiment method 900 for forming an FLT 102_x. The method 900 begins in a step 902, in which the semiconductor substrate 104 (FIGS. 1-8) is obtained. The semiconductor substrate may be a portion of a semiconductor wafer which, at this stage, will have incurred some earlier processing steps. Such processing steps may include, for example, wafer cleaning (e.g., chemical and/or mechanical), isolation, and possible formation of structures or regions below the upper surface 104US. Next, the method 900 continues from the step 902 to a step 904.

In the step 904, portions of the FLT 102_x are formed, which can include some or all of its gate 106, source region 114, and drain region 116. These portions can be formed using various different technologies, and in various shapes and dimensions, including, for example, with a gate path that includes plural parallel portions in a multi-finger structure, and/or with LDMOS technology. Next, the method 900 continues from the step 904 to a step 906.

In the step 906, one or more channel inhibiting regions are formed proximate a portion or portions of the path of the gate 106. Each channel inhibiting region may be formed using various example embodiments. For example, a channel inhibiting region may be formed by: (i) including at least two discontinuities along the path of the gate conductor, thereby forming an isolated portion of the gate conductor from the remainder of the gate path; (ii) including a blocking insulator, such as an STI, below the substrate upper surface 104US and blocking a conductive path between the source region 114 and the drain region 116; or (iii) selectively inhibiting the formation of a portion of either the source and drain, leaving behind a structure that is not conducive to providing a current path to the other of the source and the drain. Next, the method 900 continues from the step 906 to a step 908.

In the step 908 and following, formation processes are performed beyond those described above, so as to complete any circuit features, connections, and the like for ICs of the semiconductor wafer. In this regard, silicides may be formed, as may additional layers and/or other devices for each IC on the wafer. Thereafter, each IC formed on the wafer can be separated from the wafer, packaged, tested, and ultimately if satisfactory, approved for distribution, such as by sale and delivery to a customer.

From the above, one skilled in the art should appreciate that example embodiments are provided for IC semiconductor fabrication, for example with respect to an IC that includes a HV transistor (or multiple HV transistors). Such embodiments provide various benefits, some of which are described above and including still others. For example, embodiments may implement a transistor with parallel gate portions, so as to provide an effective longer transistor gate within a relatively small area. As another example, such a transistor can be operated with reduced electric field and current density in areas where the gate path has a relatively small radius, thereby reducing the chance of failure in such areas and correspondingly improving SOA. As another example, modifications to the embodiments described are also contemplated. For example, while FIGS. 3-5 and 7 illustrate channel inhibiting regions proximate gate curves of radius r2 and curve distance cd2, similar channel inhibiting regions may be used for either larger radii (e.g., r1) and/or shorter curve distance (e.g., cd1), including for example, proximate the curved portions 110*cp_c* and 110*cp_d*. As another example, various conductivity types may be reversed in a P-type transistor implementation. Still additional modifications are possible in the described embodiments, and other embodiments are possible, within the scope of the following claims.

What is claimed is:

1. An integrated circuit, comprising:
a substrate;
a source region in the substrate;
a drain region in the substrate, wherein the drain region includes a high conductivity region formed adjacent a drift region;
a channel region between the source region and the drain region;
a gate on the substrate including at least a first linear portion, a second linear portion parallel to the first linear portion, and a curved portion connecting the first linear portion and the second linear portion; and
structure, proximate the curved portion of the gate, for inhibiting current flow along a portion of the channel region,
wherein the structure includes an insulator having a curved shape extending along the curved portion of the gate from an end adjacent the first linear portion of the gate to an end adjacent the second linear portion of the gate and a depth of the insulator in the substrate is greater than or equal to a depth of the source region in the substrate and a portion of the insulator directly contacts the high conductivity region.

2. The integrated circuit of claim 1, wherein the insulator includes a shallow trench insulator between at least a portion of the source region and a portion of the drain region.

3. The integrated circuit of claim 1,
wherein the source region includes a high conductivity region formed adjacent a complementary conductivity type region.

4. The integrated circuit of claim 3,
wherein the high conductivity region includes an n+ region; and
wherein the complementary conductivity type region includes a p type region.

5. The integrated circuit of claim 3,
wherein the high conductivity region includes a p+ region; and
wherein the complementary conductivity type region includes an n type region.

6. The integrated circuit of claim 1, wherein the source region, the drain region, and the gate are part of a multi-finger transistor.

7. The integrated circuit of claim 1, wherein the curved portion of the gate has a radius r1, with 5 µm≤r1≤200 µm.

8. The integrated circuit of claim 1,
wherein the high conductivity region includes an n+ region; and
wherein the drift region includes an n− region.

9. An integrated circuit, comprising:
a substrate;
a drain region in the substrate, wherein the drain region includes a high conductivity region formed adjacent a drift region;
a gate on the substrate including at least a first linear portion, a second linear portion parallel to the first linear portion, and a curved portion connecting the first linear portion and the second linear portion;
a source region in the substrate surrounding portions of the drain region and the gate; and
structure, proximate the gate, for inhibiting current flow along a portion of a channel region between the source region and the drain region,
wherein the structure includes an insulator having a curved shape extending along the curved portion of the gate from an end adjacent the first linear portion of the gate to an end adjacent the second linear portion of the gate and a depth of the insulator in the substrate is greater than or equal to a depth of the source region in the substrate and a portion of the insulator directly contacts the high conductivity region.

10. The integrated circuit of claim 9, wherein the curved portion of the gate has a radius r1, with 5 µm≤r1≤200 µm.

11. The integrated circuit of claim 9, wherein the source region, the drain region, and the gate are part of a multi-finger transistor.

12. A method of making an integrated circuit, comprising:
providing a source region in a substrate;
providing a drain region in the substrate, wherein the drain region includes a high conductivity region formed adjacent a drift region;
providing a channel region between the source region and the drain region;
providing a gate on the substrate including at least a first linear portion, a second linear portion parallel to the first linear portion, and a curved portion connecting the first linear portion and the second linear portion; and
providing structure, proximate the curved portion of the gate, for inhibiting current flow along a portion of the channel region,
wherein the structure includes an insulator having a curved shape extending along the curved portion of the gate from an end adjacent the first linear portion of the gate to an end adjacent the second linear portion of the gate and a depth of the insulator in the substrate is greater than or equal to a depth of the source region in the substrate and a portion of the insulator directly contacts the high conductivity region.

* * * * *